United States Patent [19]

Anderson et al.

[11] 4,167,727
[45] Sep. 11, 1979

[54] LOGIC CIRCUITS INCORPORATING A DUAL FUNCTION INPUT

[75] Inventors: Jack L. Anderson, Scottsdale; Frank J. Swiatowiecz; Marvin A. Glazer, both of Tempe, all of Ariz.

[73] Assignee: Motorola, Inc., Schaumburg, Ill.

[21] Appl. No.: 814,057

[22] Filed: Jul. 8, 1977

[51] Int. Cl.$^2$ ............................................. G06F 11/10
[52] U.S. Cl. .......................... 340/146.1 AG; 307/207; 307/209
[58] Field of Search ............ 340/146.1 AG; 307/207, 307/209; 328/92

[56] References Cited

U.S. PATENT DOCUMENTS

| | | | |
|---|---|---|---|
| 3,671,764 | 6/1972 | Maley et al. | 307/209 |
| 3,780,316 | 12/1973 | Wilhelm | 307/209 |
| 3,818,202 | 6/1974 | Ellison | 307/207 |
| 3,914,590 | 10/1975 | Irwin et al. | 307/209 X |
| 3,965,367 | 6/1976 | Mei | 307/207 |
| 4,031,410 | 6/1977 | Kikuchi | 328/92 |

*Primary Examiner*—Charles E. Atkinson
*Attorney, Agent, or Firm*—Robert D. Lott; Marvin A. Glazer

[57] ABSTRACT

A dual function capability is incorporated into one input of an emitter coupled logic gate to allow a user to selectively enable the logic circuit to operate in a multifunction mode. The dual function input can recognize both normal binary voltage levels and operate as a conventional input for digital information, and also recognize voltage levels not within the normal binary voltage levels and modify the circuit function correspondingly.

10 Claims, 14 Drawing Figures

| S | A | B | OUTPUT |
|---|---|---|--------|
| 0 | 0 | 0 | 1 |
| 0 | 0 | 1 | 0 |
| 0 | 1 | 0 | 1 |
| 0 | 1 | 1 | 0 |
| 1 | 0 | 0 | 0 |
| 1 | 0 | 1 | 1 |
| 1 | 1 | 0 | 1 |
| 1 | 1 | 1 | 1 |

FIG. 1C
(PRIOR ART)

| A | B | OUTPUT |
|---|---|--------|
| 0 | 0 | 0 |
| 0 | 1 | 1 |
| 1 | 0 | 1 |
| 1 | 1 | 1 |
| 2 | 0 | 1 |
| 2 | 1 | 0 |

FIG. 2C

| A | B | C | $S_D$ |
|---|---|---|-------|
| 0 | * | * | 0 |
| 1 | * | * | 1 |
| 2 | 0 | * | 0 |
| 2 | 1 | * | 1 |
| 3 | * | 0 | 0 |
| 3 | * | 1 | 1 |

FIG. 5C

* = DON'T CARE

| $A_0$ | ADDRESS PARITY STATUS | DATA PARITY STATUS | SYSTEM PARITY STATUS |
|-------|----------------------|--------------------|----------------------|
| 0 | 0 | 0 | 0 |
| 0 | 0 | 1 | 1 |
| 0 | 1 | 0 | 1 |
| 0 | 1 | 1 | 1 |
| 1 | 0 | 0 | 0 |
| 1 | 0 | 1 | 1 |
| 1 | 1 | 0 | 1 |
| 1 | 1 | 1 | 1 |
| 2 | 0 | 0 | 0 |
| 2 | 0 | 1 | 1 |
| 2 | 1 | 0 | 0 |
| 2 | 1 | 1 | 1 |

FIG. 3C

| $S_1$ | $S_2$ | A | B | C | $S_D$ |
|---|---|---|---|---|---|
| 0 | 0 | 0 | * | * | 0 |
| 0 | 0 | 1 | * | * | 1 |
| 0 | 1 | * | 0 | * | 0 |
| 0 | 1 | * | 1 | * | 1 |
| 1 | 0 | * | * | 0 | 0 |
| 1 | 0 | * | * | 1 | 1 |
| 1 | 1 | * | * | * | 0 |
FIG. 4B
(PRIOR ART)
* = DON'T CARE
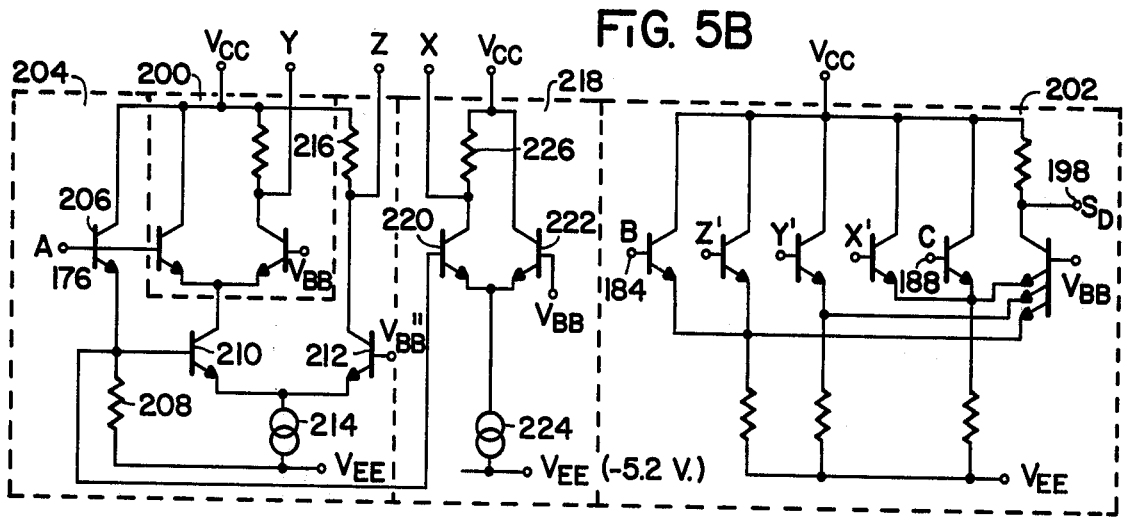
FIG. 5B
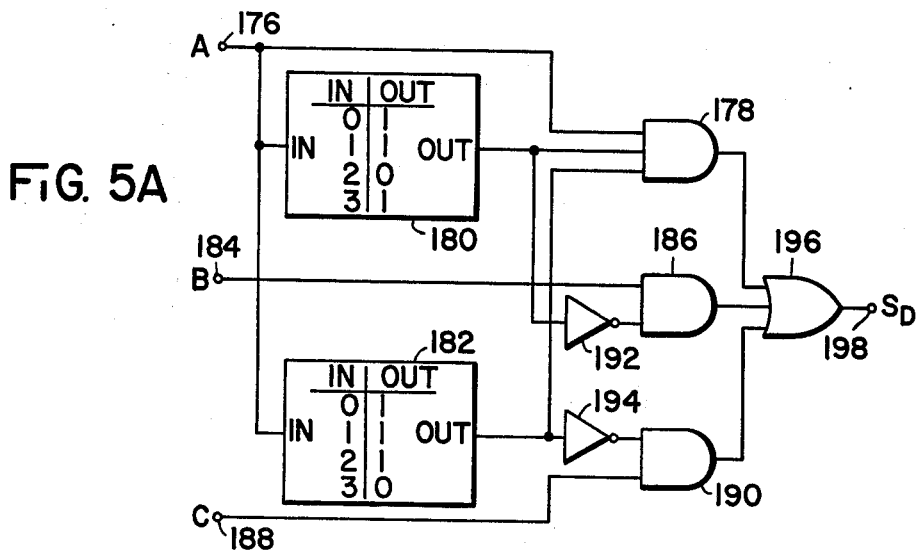
FIG. 5A

LOGIC CIRCUITS INCORPORATING A DUAL FUNCTION INPUT

BACKGROUND OF THE INVENTION

This invention relates to binary logic circuits, and more particularly to emitter coupled logic circuits (ECL).

A widely used dual-in-line package for logic integrated circuits is limited to fourteen or sixteen pins. As a result the number of inputs and outputs to a logic circuit used with that package are limited by the pins on the package. Thus the integrated circuit designer also is pin limited; that is, his circuit design is constrained by the number of inputs and outputs allowed by the package type selected. Often the availability of an extra input allows the inclusion of an additional logic function to be in the same package.

Moreover, two different users may require similar functions in an integrated circuit, but these functions are often different enough to prohibit a manufacturer from meeting both users' demands with the same integrated circuit due to the limitations of the package. A solution in the past has been to incorporate both functions on a single integrated circuit chip, but to change the metallization on the chip for the two different users to modify the function to satisfy the user requirements. However this solution has the undesirable effect of requiring separate device types, separate inventory, separate testing programs and separate processing steps for the two device types. It can be appreciated that a dual function input which would allow a logic circuit to perform the separate and distinct functions required by two separate users would be highly desirable.

SUMMARY OF THE INVENTION

It is therefore an object of this invention to provide a logic circuit in which an input would have a dual function capability.

It is another object of this invention to provide a logic circuit whose function can be selected via one of the data inputs to the circuit.

It is still another object of this invention to provide a single integrated circuit suitable for two different users requiring distinct functions from the same circuit.

It is another object of this invention to increase the versatility of the logic functions within a pin limited integrated circuit package.

In accordance with the above objects, a logic circuit is provided having a first stage for generating an output signal representative of a first or a second logic function in response to a multiple value digital signal and at least one binary signal. An enabling stage responsive to the multiple value digital input signal selectively generates enable signals which are coupled to the output stage. The first stage is responsive to the enable signals and to the multiple valued and binary input signals and generates an output signal representative of either a first or the second logic function.

BRIEF DESCRIPTION OF THE DRAWINGS

FIGS. 1A, 1B and 1C show a logic diagram, circuit diagram, and truth table of a logic function implemented by a prior art emitter coupled logic circuits.

FIGS. 3A, 3B and 3C show a logic diagram, circuit diagram, and truth table of a parity checker circuit which utilizes a dual function input.

FIGS. 4A and 4B show a logic circuit and truth table of a conventional three input multiplexer.

FIGS. 5A, 5B and 5C show a logic diagram, circuit diagram, and truth table of the logic function of FIG. 4 utilizing the dual function input.

DESCRIPTION OF THE PREFERRED EMBODIMENT

Figure 1A:
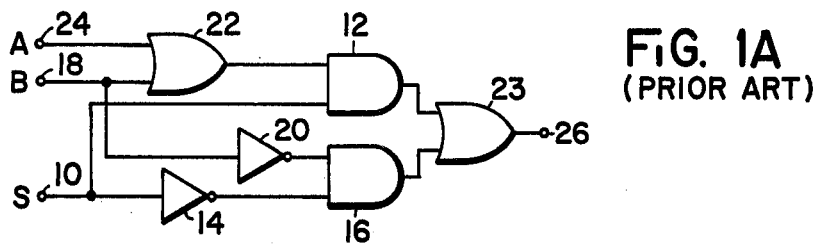
Figure 1B:
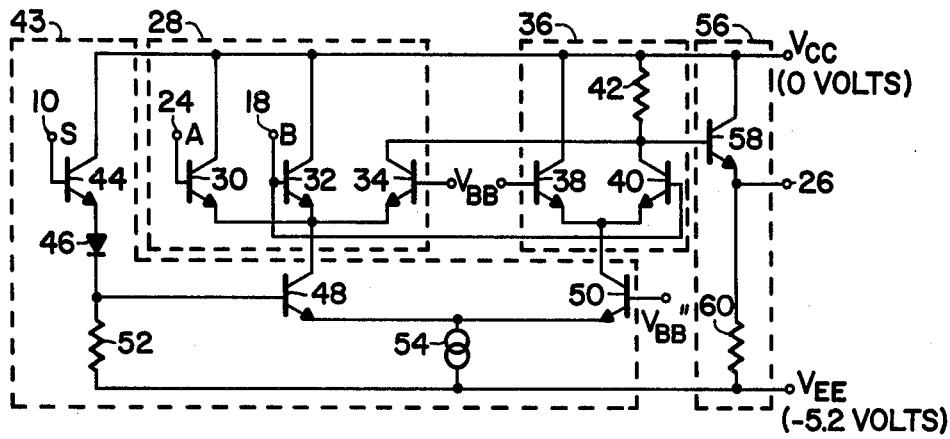

Referring now to FIG. 1, a prior art emitter coupled logic function is shown symbolically in the logic diagram of FIG. 1A electrically in the circuit diagram of FIG. 1B, and logically in the truth table of FIG. 1C. The logic circuit has an output which is one of two functions, either the A+B function, or the $\overline{B}$ function as determined by the S input. In FIG. 1A, the logic S input terminal 10 is connected to one input of a dual input AND gate 12, and also to an inverter 14, which in turn connects the inverted S input to another dual input AND gate 16. The other input of AND gate 16 is the $\overline{B}$ function which is generated by coupling the B input at terminal 18 through an inverter 20. The B input at terminal 18 is also fed into one input of a dual input OR gate 22. The second input of the OR gate 22 is the A input at input terminal 24. The output of OR gate 22, which is the A+B function, is in turn fed into the second input of AND gate 12. The outputs of AND gates 12 and 16 are fed into the inputs of a dual input OR gate 23. The output of the OR gate 23 is connected to the output terminal 26.

In operation, still referring to FIG. 1A, either AND gate 12 or AND gate 16 is enabled depending on the logic state of the S input appearing at terminal 10. When the S input is high or the logical "1" state, AND gate 12 is enabled and the output of OR gate 22 which forms the A+B function is coupled to the output gate 23 and thereby to the output terminal 26. When the S input is in the low state or the "0" logic level, inverter 14 inverts the "0" level to a "1" level to enable AND gate 16 which in turn passes the $\overline{B}$ function appearing at the output of inverter 20 through the output OR gate 23 and on to the output terminal 26.

FIG. 1B is an electrical schematic diagram of an emitter coupled logic circuit commonly employed to implement the logic diagram of FIG. 1A. The circuit operates between a positive DC voltage, VCC, of 0 volts or ground potential, and a negative supply voltage, VEE, of $-5.2$ volts. A first logic stage 28 contains transistors 30, 32 and 34 connected in a differential manner to form the A or B logic function as is common in emitter coupled logic circuits. The bases of the three transistors 30, 32 and 34, are connected to the A input, B input, and VBB respectively wherein VBB and VBB" are bias voltages of $-3V$ and $-2.8V$ respectively generated inside the logic circuit by a biasing network (not shown). Block 36 contains a second logic stage wherein the B input is coupled to a differential pair of transistors 38 and 40 and together with collector resistor 42 and biasing voltage VBB form the $\overline{B}$ function in a conventional manner. An enabling stage 43 receives the S input at 10 and voltage shifts the input through transistor 44 and diode 46 onto the differential transistor pair 48 and 50. These three transistors and the diode together with biasing resistor 52 and current source 54 form the enabling stage in a conventional manner to in turn form enabling signals at the collectors of transistors 48 and 50 to selectively enable either the A+B function of block 28 or the $\bar{B}$ function of block 36 by allowing current to flow through the respective differential pair. This enabling or series gating is common in emitter coupled logic and well known to anyone skilled in the art. Output stage 56 receives the logic signals from blocks 28 and 36 into the base of a transistor 58 to in turn transfer the logic function generated onto biasing resistor 60 and output terminal 26.

The truth table of FIG. 1C shows the output for both the logic diagram of FIG. 1A and the circuit diagram of FIG. 1B for each of the possible states of the S input, the A input, and the B input.

Figure 2A:
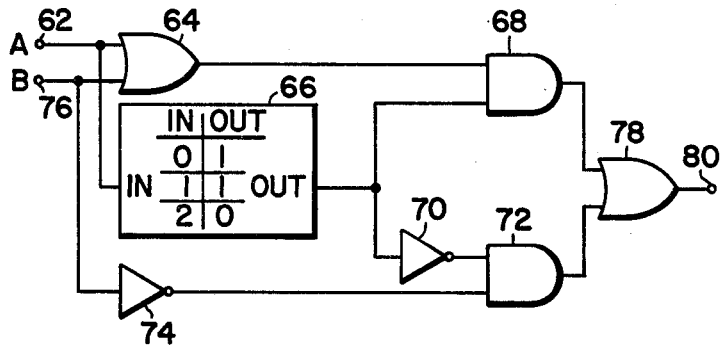
FIGS. 2A, 2C show a logic diagram, circuit diagram, and truth table of the logic function of FIG. 1 utilizing the dual function input.
Figure 2B:
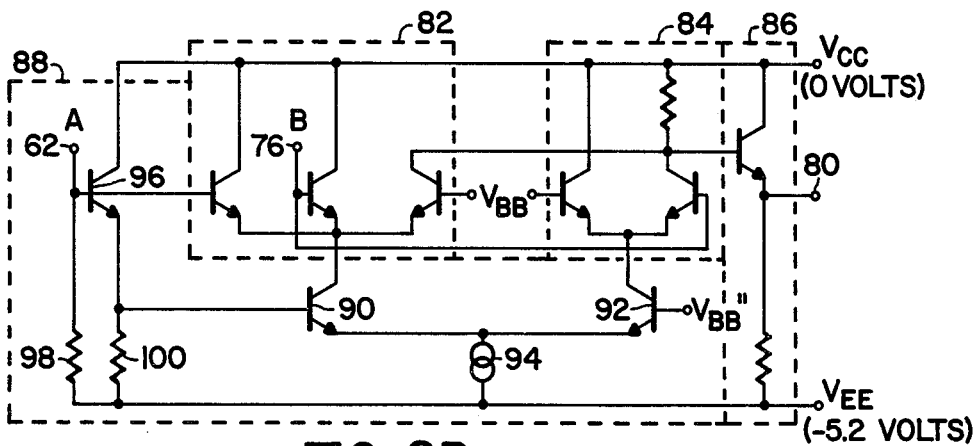

FIG. 2 shows an emitter coupled logic circuit that performs all of the functions of the conventional circuit of FIG. 1 and also is capable of accommodating a dual function input signal. The dual function input has been substituted for the S and the A input of FIG. 1 to eliminate the requirement for the two separate inputs and thus save one input pin of a corresponding logic circuit package. This dual function or multiple-valued input will be referred to as the A input. The corresponding logic is shown in the logic diagram of FIG. 2A; the electrical realization is shown in FIG. 2B; and the corresponding truth table is shown in FIG. 2C. The logic diagram of FIG. 2a has an A input at terminal 62 which is connected to one input of a dual input OR gate 64 and also to the input of a special logic gate shown as gate 66. The output of gate 66 is connected to one input of a dual input AND gate 68 the other input of which is connected to the output of OR gate 64. The output of gate 66 is also coupled through an inverter 70 into one input of a dual input AND gate 72. The other input of AND gate 72 comes from an inverter 74 which in turn has its input connected to the B input appearing at terminal 76. The B input is also connected to the second input of OR gate 64. The outputs of AND gates 68 and 72 form the two inputs of a dual OR gate 78 whose output in turn is connected to the output terminal 80.

In operation the logic diagram of FIG. 2A receives an A input at terminal 62 and is ORed with the B input at terminal 76 via OR gate 64 to form the A+B function and fed into one input of AND gate 68. Also the $\bar{B}$ function is formed at the output of inverter 74 and fed into one input of AND gate 72. The other inputs of AND gates 68 and 72 are controlled by the output of the special logic gate of gate 66. Gate 66 receives the A input and provides a one level output if the A input is either in the logic "1" state or the logic "0" state. This logical "1" output thereby enables AND gate 68 to pass the A+B function through OR gate 78 to the output terminal 80. If the A input to gate 66 is in a third state or logical "2" state, which for this circuit is any voltage less than (more negative than) −2.1 volts, then the output of block 66 will be a logical "0". This is inverted by inverter 70 to enable AND gate 72 to pass the $\bar{B}$ function through the output OR gate 78 to the output terminal 80. Thus the logic gate 66 has an enabling gate which differentiates normal logic levels from a third or special logic level which may appear at the A input.

FIG. 2B is a circuit diagram of an electrical circuit which realizes the logic function of FIG. 2A. The circuit of FIG. 2B is very similar to the circuit of FIG. 1B. In FIG. 2B the A+B logic stage 82, the $\bar{B}$ logic stage 84, and the output stage 86, are identical to stages 28, 36 and 56 respectively of FIG. 1B. The enabling stage 88 of FIG. 2B is also similar to the enabling stage 43 of FIG. 1B in that a differential pair of transistors 90 and 92 together with current source 94 provide enable signals for stages 82 and 84 which select either the A+B function or the $\bar{B}$ function. Instead of the separate S input of FIG. 1B, however, the A input is passed through transistor 96 of FIG. 2B and into the base of transistor 90 of the enabling stage differential pair. Thus the A input passes through one base emitter junction into the base of transistor 90 and is compared against the VBB" bias voltage connected to the base of transistor 92. Since the VBB" bias voltage is −2.8 volts, the differential transistors 90 and 92 will either become conducting or nonconducting depending on whether the base of transistor 90 is greater than or less than −2.8 volts. Because the base-emitter drop of transistor 96 is approximately 0.7 volts, an A input greater than (more positive than) −2.1 volts causes enable stage 88 to be in a first state while an A input less than −2.1 volts will cause the enable stage 88 to be in a second state. More specifically if the A input is greater than −2.1 volts, transistor 90 will be conducting thereby enabling the A or B function of logic stage 82. If the A input at terminal 62 is less than −2.1 volts, then transistor 90 will be nonconducting and transistor 92 will be conducting to enable the $\bar{B}$ function of logic stage 84. Thus the A input is a dual function input which operates either as a normal binary logic input, or as a control input to select an alternate function for the logic gate. Moreover the function of the logic gate is programmable via one of the data inputs to the circuit. Thus the versatility of the logic package which incorporated in a multiplexer would be increased since two inputs are performing the function required by three inputs of the conventional logic circuit. Two separate users would be able to utilize the same logic circuit even though the functions required by both would be different.

A user wishing the A+B function would apply normal emitter coupled logic levels to the A and B inputs. The user requiring the $\bar{B}$ function would connect the A input to VEE (−5.2V), or leave the A input open to allow the pulldown resistor 98 to couple VEE to the A input, and apply normal ECL logic levels to the B input.

A comparison of the conventional circuit of FIG. 1B and the circuit of FIG. 2B which incorporates one embodiment of the invention shows that realizing the invention involves only minor changes to the conventional circuit. Further the process steps involved in manufacturing the ECL logic circuits incorporating a dual function input are the same as those used to manufacture conventional ECL circuits.

FIG. 2C is a truth table indicating the logical output at terminal 80 for the various combinations of the A and B inputs.

Figure 3A:
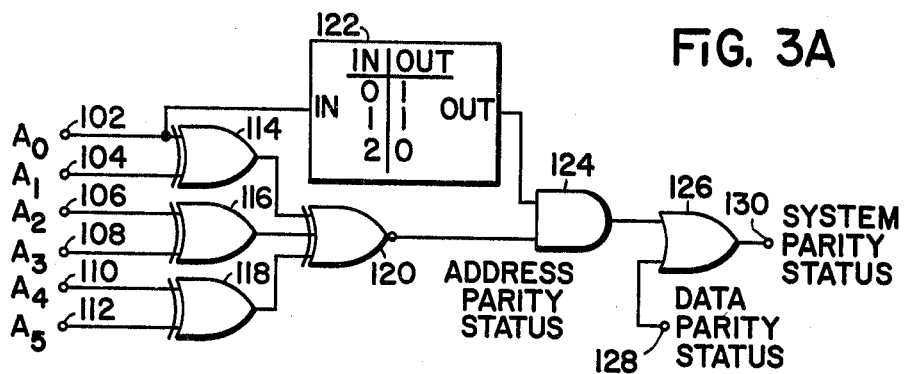

Turning now to FIG. 3, an address parity checker circuit which incorporates a dual function input is used in conjunction with a data parity checker to provide system parity status. The logic diagram of FIG. 3A shows an address parity input A0 and five address inputs A1, A2, A3, A4, and A5, appearing on input lines 102, 104, 106, 108, 110, and 112 respectively. Inputs A0 and A1 are connected to the two inputs of a dual input Exclusive OR gate 114 and inputs A2 and A3 form the inputs to the dual input Exclusive OR gate 116 and inputs A4 and A5 form the inputs to the dual input Exclusive OR gate 118. The three outputs from these three Exclusive OR gates are in turn fed into the three inputs of an Exclusive NOR gate 120, the output of which forms the address parity status of inputs A0 through A5. Input A0 is also connected to the input of special logic gate 122. Output of gate 122 is ANDed with the output of gate 120 via AND gate 124. The output of gate 124 is fed into one input of dual input OR gate 126. The output input of the dual input OR gate 126 is data parity status appearing at input terminal 128. The output of the OR gate 126 is connected the output terminal 130 and represents the system parity status.

In operation, the parity A0 and address inputs A1-A5 of FIG. 2A are Exclusively OR'd together in gates 114, 116, 118, and 120 to form the normal parity status of the address inputs. If the address parity status is to be reflected in the system parity status, then normal ECL binary logic levels are applied to the A0 parity bit input. The logical "1" or "0" A0 into the special logic gate 122 would result in a "1" level at the output of gate 122 to, in turn, enable AND gate 124. The address parity status would be coupled to OR gate 126 to be OR'd with the data parity status to provide the overall system parity status at output terminal 130. If, however, the system parity status is to be independent of address parity, then the A0 input would be connected to the minus supply voltage, VEE, of −5.2 volts. This would, in turn, cause special logic gate 122 to become a logical "0" at the output of the gate and disable AND gate 124. Thereby the system parity status would only be a function of the data parity status and the parity of the address bits would be ignored.

Figure 3B:
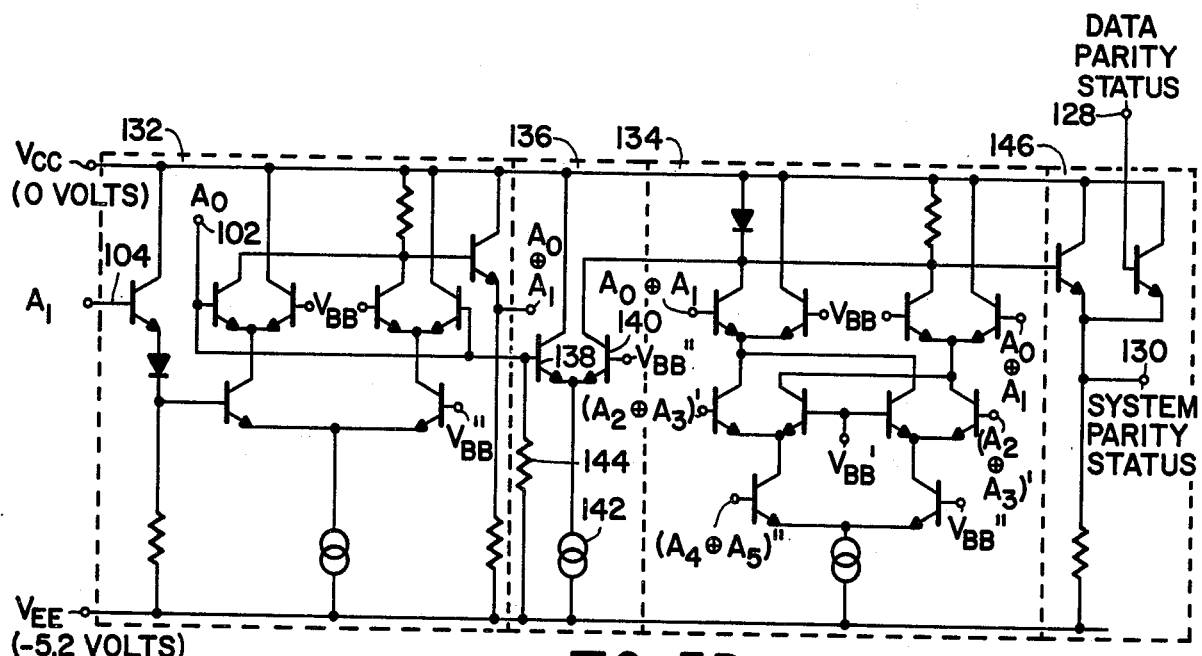

FIG. 3B shows a circuit diagram of the address parity checker which incorporates a dual function input. The Exclusive OR stage 132 is used to form the exclusive OR of A0 and A1 (A0⊕A1). Two similar circuits (not shown) form the Exclusive OR of A2 and A3, and A4 and A5. These Exclusive OR circuits are common in the emitter coupled logic and well known to anyone skilled in the art. A three input Exclusive NOR gate comprises the logic circuitry of block 134 in which the Exclusive OR functions of A0⊕A2, A2⊕A3 and A4⊕A5 are Exclusively NORed together to form the address parity status. Note that the A0⊕A1 output comes directly from the output of block 132, but the A2⊕A3 and the A4⊕A5 have been voltage shifted: one base-emitter drop for A0⊕A3 and two base emitter-drops for A4⊕A5 as indicated by the prime and double prime notations. Again the circuitry of block 134 is common in emitter coupled logic and well known to anyone skilled in the art. Block 136 is the enable circuit of the parity checker which receives the multiple valued input of A0 and differentiates the normal binary "1" and "0" logic states from a third logic state via differential transistors 138 and 140 which operate in conjunction with the current source 142. Also an input biasing resistor 144 is connected to a bias voltage, in this case VEE. The enable signal from the enable circuit of block 136 is collector dotted with the output of the Exclusive NOR gate of block 134 and connected to the base of one transistor of the output stage 146. The data parity status is ORed in the output stage 146 in a conventional manner to produce a system parity status at output terminal 130.

In operation, the circuit of FIG. 3B provides a system parity status output at terminal 130 which is a function of the address parity status whenever the A0 input at terminal 102 is in the logical "1" or the logical "0" state. That is, whenever the A0 input is higher than the VBB" bias voltage of −2.8 volts, then the output of the differential pair of transistors 138 and 140 will be a high impedance to the output of the NOR gate of block 134 to allow block 134 in conjection with block 132 and the two blocks similar to block 132 to function as a normal Exclusive NOR parity checker circuit. If the A0 input drops below the VBB" bias voltage, then the output of the differential pair of transistors 138 and 140 will cause the output from the Exclusive NOR block 134 to be a low level irrespective of the other inputs of the address parity status circuit. In this case the system parity status will be a function only of the data parity status. Note that if the bias resistor 144 is connected to VEE and there is a fault in the input to the A0 line such that the A0 input becomes disconnected, then the system will disregard the address parity status while in fact there may actually be parity errors occurring in the address inputs. Thus it may be more appropriate to connect the bias resistor 144 to a level above VBB" such as VBB' (−2.1 volts) so that an inadvertent disconnection of the A0 input will indicate a series of address parity errors to alert the user to a fault in the system.

Note that the multiple valued input of FIG. 3B allows the user to either take advantage of the address parity status function built into a logic integrated circuit or to bypass the address parity status function by selecting the appropriate A0 input. More specifically if the user wishes to incorporate the address parity status into his system parity status, the A0 input is driven as a normal parity bit. If on the other hand the user wishes to ignore the address parity status, he would connect the A0 input to the VEE power supply of −5.2 volts which would disable the address parity function. Thus it is possible to supply the needs of two users without having to increase the pin count on an integrated circuit package. Conversely it is possible to include both functions in a pin limited package by taking advantage of a dual function input. Thus the versatility of the logic functions inside the integrated circuit package is improved upon.

The truth table of FIG. 3C shows the system parity status as a function of data parity status and the address parity status of the A0 through A5 inputs.

Figure 4A:
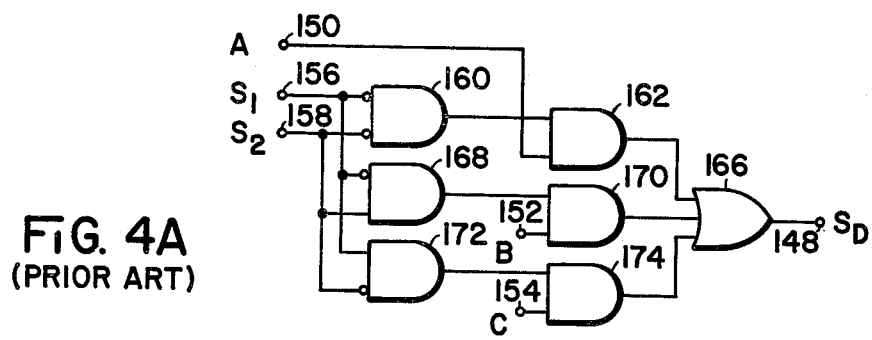

FIG. 4 shows a logic diagram and truth table for a one of three data selector. In FIG. 4A the output at terminal 148 is either the A input at terminal 150, or the B input at 152, or the C input at 154 depending on the states of the two select inputs S1, at terminal 156, or S2, at terminal 158. The S1 and S2 inputs are inverted and ANDed together by a dual input inverting AND gate 160 the output of which in turn is coupled into one input of a dual input AND gate 162. The second input of AND gate 162 is the A input terminal 150. The output of AND gate 162 is in turn fed into one of three inputs of OR gate 166, the output of which is connected to the output terminal 148. The S1 input is inverted and ANDed together with the S2 input by a dual input AND gate 168; the output of which is fed into the one input of a dual input AND gate 170 to enable the B input at 152 to be transferred to the ORing gate 166. Finally the S1 input is ANDed together with the inverse of the S2 input by a dual input AND gate 172 the output of which enables a dual input AND gate 174 to couple the C input to the third input of OR gate 166.

The operation of the logic diagram of FIG. 4A is illustrated in the truth table of FIG. 4B. The A input is passed to the output at terminal 148 whenever the S1 and S2 inputs are both in the low or logical "0" state. Under this condition the AND gate 160 has a high or logical "1" output to enable AND gate 162 to pass the A data through output gate OR 166 onto the output terminal 148. In a similar manner the B input is enabled whenever the S1 input is low and the S2 input is high in which case AND gate 168 is enabled providing a logical "1" to AND gate 170 to in turn couple the B input through the OR gate 166 to the output terminal 148. The C input is coupled to the output whenever the S1 input is high and the S2 input is low since AND gate 172 has a logical "1" output which enables AND gate 174.

FIG. 5 shows a third embodiment of the dual function input wherein the logic function shown by the conventional logic diagram of FIG. 4 is realized with a reduction in the number of input terminals from five to three. The novel circuit is shown symbolically in the logic diagram of FIG. 5A, electrically in the circuit diagram of FIG. 5B, and logically in the truth table of FIG. 5C. The A input of FIG. 5A at terminal 176 is connected to three logic gates. The first gate is a three input AND gate 178, the second is a first enable gate 180 and the third connection is a second enable gate 182. The B input appearing at terminal 184 is connected to one input of a dual input AND gate 186 and a C input at terminal 188 is connected to one input of another dual input AND gate 190. The output of the first enabling gate 180 is coupled to the second of three inputs to AND gate 178 and is also inverted by inverter 192 and subsequently coupled to the second input of AND gate 186. The output of the second enable gate 182 is connected to the third input of the three input AND gate 178, and also inverted by inverter 194 and subsequently coupled to the second input of AND gate 190. The outputs of the three AND gates 178, 186, and 190 form the three inputs of the three input OR gate 196 which in turn drives the output terminal 198.

In operation, the selection A or B or C is performed by the A input. Thus if the A input has a normal logical "0" or logical "1", then the first enable gate 180 will have a "1" output, and the second enable gate 182 will have a "1" output which will in turn enable the three input AND gate 178 and also disable AND gates 186 and 190 to in turn transfer the A function to the output terminal 198. The B input is transferred to the output terminal 198 whenever the A input is in a logical "2" state or −5.2V. When the A input is in the logical "2" state, then the first enable gate 180 has a logical "0" output which in turn disables AND gate 178 and also enables AND gate 186 via inverter 192. The second enable gate 182 still has a logical "1" output which, after being inverted by inverter 194, disables AND gate 190. Thus the output at terminal 198 is the same as the output of AND gate 186 which in turn is the same as the B input. Finally the C input is selected whenever the A input is in the logical "3" state or ground potential. Under these conditions the first enable gate 180 has a logical "1" output which via inverter 192 disables AND gate 186. The second enable gate 182 has a logical "0" output which disables AND gate 178 but enables AND gate 190 through the inverter 194. Thus the C input is coupled through AND gate 190 and OR gate 196 onto the output terminal 198.

FIG. 5B is a circuit representation of the logic diagram of FIG. 5A. The logic circuitry of block 200 is an input buffer as is conventional in the art, while the circuitry of block 202 performs the functions of AND gates 178, 186 and 190 and OR gate 196 of FIG. 5A. Again the circuitry in block 202 is conventional emitter coupled logic gating and well known to anyone skilled in the art. What is unconventional is the first enable gate of block 204 which comprises a voltage shifting transistor 206 the emitter of which is connected to a biasing resistor 208 and also to the base of a first transistor 210 of a differential pair of transistors. Transistor 210 is differentially connected to a second transistor 212 the base of which is connected to bias voltage VBB" of −2.8 volts. The transistor pair 210 and 212 are in turn connected to a current source 214 and the collector of transistor 212 is connected to a pull-up resistor 216 the other end of which is connected to VCC. The input shifted voltage appearing at the emitter of transistor 206 is also connected to block 218 which comprises the second enable gate. The A shifted input is connected to the base of transistor 220 which forms a differential pair with transistor 222 and current source 224. The collector of transistor 220 is connected to a first pull-up resistor 226 and the collector of transistor 222 is connected to VCC and the base of transistor 222 is connected to bias voltage VBB of −1.3 volts. The bias voltages indicated in the circuit are generated by biasing networks inside the circuit but not shown in the circuit diagram.

The operation of the A buffer of block 200 of FIG. 5B is conventional in operation and provides the buffered A input on the Y interconnect line. The first enable circuit of block 204 recognizes either voltages on the A input which are greater than −1.2 volts to enable the buffer of block 200; or voltages on the A input which are less than −2.1 volts to disable the buffer of block 200 and also provide a low level on the Z interconnect line. The second enable gate of block 218 differentiates A inputs which are greater or less than −0.7 volts. When The A input is greater than −0.7 volts, the X interconnect is pulled low to in turn allow the C input to be transferred to the output terminal 198. However when the A input drops below −0.7 volts, transistor 220 ceases to conduct which provides a high input on the X line thereby disabling the C input. The output gate of block 202 combines the B and C inputs and the X, Y and Z interconnects of circuit blocks 200 and 204, after the X, Y and Z interconnects have been voltage level shifted by one base-emitter drop to form X', Y', and Z' respectively as conventional is emitter coupled logic, to provide the appropriate data on the output terminal 198.

FIG. 5C is a truth table of the output for each state of the A, B, and C inputs of the logic circuit of FIG. 5A and FIG. 5B.

The circuit of FIG. 5 incorporates a multiple-valued input which accepts four logic states, two of which are the normal ECL logical "0" levels. The other two states are a high level greater than −0.7 volts which a user would realize by tieing the input to VCC or ground potential, and a fourth level of less than −2.1 volts which a user would realize by tying the input to VEE or −5.2 volts. The advantage of the circuit of FIG. 5 is that a five input logic circuit has been replaced by a three input logic circuit thereby saving two input pins on a logic integrated circuit package.

While the invention has been particularly shown and described with reference to preferred embodiments thereof, it will be understood by those skilled in the art that various changes in form and details may be made therein without departing from the spirit and scope of the invention.

What is claimed is:

1. A logic circuit comprising:
(a) first input means for receiving a digital signal, the digital signal having at least three discrete logic levels;
(b) second input means for receiving at least one binary signal;

(c) at least one enabling means coupled to said first input means and responsive to the digital signal for generating at least one enable signal; and (d) logic means coupled to said first and second input means and responsive to the digital signal and to the at least one binary signal for selectively generating a binary output signal representative of one of a plurality of logic functions, said logic means being responsive to the at least one enable signal for determining which logic function of the plurality of logic functions is represented by the binary output signal.

2. A logic circuit as recited in claim 1 wherein said at least one enabling means comprises first semiconductor switching means coupled to said first input means and responsive to the digital signal for causing the at least one enable signal to indicate an occurrence of the digital signal being in a first logic level among the at least three discrete logic levels.

3. A logic circuit as recited in claim 2 wherein said first semiconductor switching means is adapted to receive a reference signal, said first semiconductor switching means being operative to compare the digital signal to the reference signal in order to detect an occurrence of the digital signal being in the first logic level.

4. A logic circuit as recited in claim 2 wherein said logic means includes second semiconductor switching means coupled to first input means and responsive to the digital signal for generating at least one of the plurality of logic functions, said second semiconductor switching means being operative to detect a transition of the digital signal between a second logic level and at least a third logic level among the at least three logic levels.

5. A logic circuit as recited in claim 4 wherein said second semiconductor switching means is adapted to receive a reference signal, said second semiconductor switching means being operative to compare the digital signal to the reference signal in order to detect the transition of the digital signal between the second and at least third logic levels.

6. A logic circuit as recited in claim 4 wherein said logic means is adapted to select said at least one of the plurality of logic functions generated by said second semiconductor switching means for representation by the binary output signal only when the at least one enable signal indicates that the digital signal is not in the first logic level.

7. A logic circuit as recited in claim 4 wherein said first and second semiconductor switching means each comprise differentially coupled transistor switches.

8. A logic circuit as recited in claim 4 wherein said first and second semiconductor switching means each comprise emitter-coupled logic circuits.

9. A logic circuit comprising:
(a) first means for receiving a digital signal, the digital signal having at least three logic levels;
(b) first switching means for implementing a first binary logic function, said first switching means being coupled to said first means and being responsive to the digital signal such that the first binary logic function is dependent upon whether the digital signal is in a first or in a second logic level;
(c) second switching means for implementing a second binary logic function, said second switching means being responsive to at least one binary input signal, the second binary logic function being independent of the digital signal;
(d) enable means coupled to said first means and responsive to the digital signal for generating an enable signal, said enable means being effective to discern the first and second logic levels of the digital signal from at least a third logic level of the digital signal such that the enable signal is in a first state when the digital signal is in the first or second logic levels and in a second state when the digital signal is in the at least third logic level; and
(e) output means coupled to said first and second switching means for selectively generating a binary output signal, said output means being responsive to the enable signal such that the binary output signal is representative of the first or second binary logic function in accordance with the enable signal being in the first or second state, respectively.

10. A logic circuit as recited in claim 9 wherein said first and second switching means and said enable means each comprise differentially coupled transistor circuits.

* * * * *